(12) United States Patent
Lin et al.

(10) Patent No.: US 12,507,491 B2
(45) Date of Patent: Dec. 23, 2025

(54) STORAGE NODE LIGHT SHIELD FOR PIXEL OF IMAGE SENSOR

(71) Applicant: Taiwan Semiconductor Manufacturing Company, Hsinchu (TW)

(72) Inventors: Chung-Yi Lin, Hsinchu (TW); Yueh-Chuan Lee, Hsinchu (TW); Chia-Chan Chen, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 430 days.

(21) Appl. No.: 18/093,050

(22) Filed: Jan. 4, 2023

(65) Prior Publication Data

US 2024/0079439 A1 Mar. 7, 2024

Related U.S. Application Data

(60) Provisional application No. 63/403,972, filed on Sep. 6, 2022.

(51) Int. Cl.
 H10F 39/18  (2025.01)
 H04N 25/532 (2023.01)
 H10F 39/00  (2025.01)

(52) U.S. Cl.
 CPC ........... *H10F 39/18* (2025.01); *H04N 25/532* (2023.01); *H10F 39/014* (2025.01); *H10F 39/8037* (2025.01); *H10F 39/8057* (2025.01)

(58) Field of Classification Search
 CPC .. H10F 39/18; H10F 39/8037; H10F 39/8057; H10F 39/014; H04N 25/532
 See application file for complete search history.

(56) References Cited

U.S. PATENT DOCUMENTS 11,240,452 B2 * 2/2022 Sugizaki ............... H04N 25/771
2017/0141145 A1 * 5/2017 Yamashita ............ H10F 39/199

\* cited by examiner

*Primary Examiner* — Mary Ellen Bowman
(74) *Attorney, Agent, or Firm* — Lippes Mathias LLP (57) ABSTRACT

A pixel of an image sensor includes: a semiconductor material substrate; a photosensitive region formed in the substrate, the photosensitive region generating photo-induced electrical charge in response to illumination with light; a storage node formed in the substrate proximate to the photosensitive region, the storage node selectively receiving and storing photo-induced electrical charge generated by the photosensitive region; and a shield formed over the storage node which inhibits light from reaching the storage node, the shield including an extension which protrudes into the substrate and surrounds an outer periphery of the storage node.

20 Claims, 11 Drawing Sheets

STORAGE NODE LIGHT SHIELD FOR PIXEL OF IMAGE SENSOR

PRIORITY CLAIM AND CROSS-REFERENCE

This application claims the benefit of U.S. Provisional Patent Application No. 63/403,972, filed Sep. 6, 2022, which is incorporated by reference herein in its entirety.

BACKGROUND

The following relates to the semiconductor arts, and in particular, to an semiconductor image sensor, for example, such as a global shutter (GS) complementary metal-oxide semiconductor (CMOS) image sensor (CIS), and manufacturing processes and/or methods therefor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features as shown in the accompany figures may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Further, it is to be understood that when an element is referred to as being "connected to" or "coupled to" another element, it may be directly connected to or coupled to the other element, or one or more intervening elements may be present. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "left," "right," "side," "back," "rear," "behind," "front," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some suitable embodiments disclosed herein, a CIS or other like or suitable image sensor is provided with an active pixel including a light-shielding structure, for example, made of an appropriate metal or other suitable material, which overlays a memory node or storage node (SN) and extends into a substrate in which the SN resides and/or is formed. In some suitable embodiments, an extension of the light-shielding structure protruding into the substrate surrounds and/or encircles an entire periphery or nearly the entire periphery of the SN. In some suitable embodiments, the light-shielding structure extension extends into the substrate to a depth deeper than where the SN resides and/or is formed in the substrate.

In practice, the light-shielding structure shields and/or protects the SN and/or associated signal processing region and/or elements of the active pixel (for example, without limitation, a SN gate structure formed on and/or over the SN) from unwanted stray or otherwise incident light, thereby advantageously guarding against light leakage into or onto these regions and/or elements so as to guard against unwanted artifacts or the like which could otherwise be produced by parasitic or other light leakage into or onto the SN and/or associated elements or region.

In some suitable embodiments, the image sensor may be a front side illuminated (FSI) image sensor. In some suitable embodiments, the image sensor may be a global shutter (GS) CIS. A GS CIS may be advantageously used in various applications, for example, because of its numerous benefits, including, without limitation, simultaneous pixel exposure and readout allowing for much higher quality imaging especially at high speeds, high frame rates, and high resolution. One suitable implementation of a GS CIS uses a memory-in-pixel approach, in which each pixel of the GS CIS, in addition to a photodiode and readout circuitry, contains an extra memory node or SN to temporarily store photo-generated charges generated by the photodiode. Using this approach, all the pixels in the CIS start an exposure at or near the same time. At the end of the exposure, photo-generated charges are globally transferred from photodiodes to corresponding local memory nodes or SNs and readout therefrom, for example, through an otherwise traditional row-by-row scanning. Suitably, the pixel-level SN receives photo-generated charges from a corresponding photodiode and allows them to accumulate, for example, eliminating a need for rolling shutter pulses. However, parasitic light or light leakage to the SN, for example, due to mechanisms like diffraction and scattering, can also generate photo-generated charges which then contaminate the stored charges in the SN, thereby potentially causing unwanted artifacts. In some suitable embodiments disclosed herein, contamination which could otherwise be caused by the parasitic light to the photo-generated charges from the photodiode and stored in the SN may be minimized before being readout, for example, in order to achieve a relatively high image quality. Advantageously, the extension of the light-shielding structure as described herein can increase and/or improve a global shutter efficiency of the image sensor, for example, as compared to some other similar image sensors without such an extension of a light-shielding structure.

Figure 1:
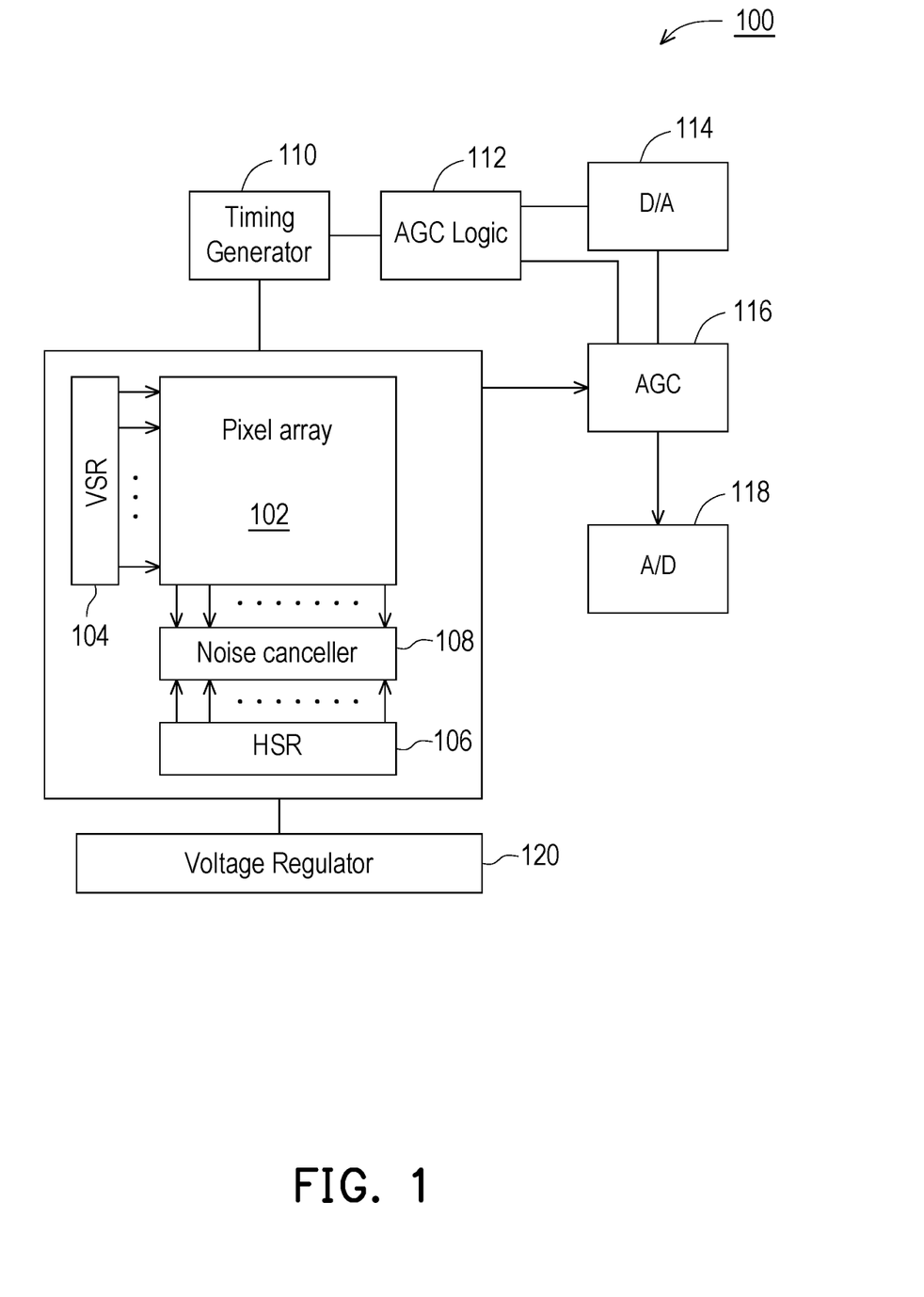
FIG. 1 illustrates a block diagram of a CIS in accordance with some embodiments disclosed herein.

With reference now to FIG. 1, there is illustrated a block diagram of an CIS 100 in accordance with some embodiments of present disclosure. It is to be appreciated that the illustrated CIS 100 is merely an example image sensor and is not intended to limit the present disclosure. Accordingly, it is understood that additional functional blocks may be provided in or coupled to the CIS 100 of FIG. 1, and that some other functional blocks may only be briefly described herein.

In the illustrated embodiment of FIG. 1, the CIS 100 includes a pixel array 102, a vertical shift register (VSR) 104, a horizontal shift register (HSR) 106, a noise canceller 108, a timing generator 110, an automatic gain control (AGC) logic 112, a digital-to-analog (D/A) convertor 114, an AGC 116, an analog-to-digital (A/D) convertor 118, and a voltage regulator 120. The pixel array 102 includes a plurality of active pixels that are arranged in a matrix of corresponding columns and rows, for example, as discussed in further detail below with reference to FIGS. 2A and/or 2B. In some suitable embodiments, the CIS 100 is a GS CIS. In some suitable embodiments, each of the plurality of active pixels of the pixel array 102 may comprise a CMOS or other suitable photodiode, a memory node or SN, and a plurality of transistors. In some suitable embodiments, the pixel array 102 may further comprises a plurality of dummy pixels suitably arranged at or near a boundary of the active pixels, which dummy pixels in effect serve as an optical dummy, for example, in order to help safeguard that the active pixels at the boundary have the same or nearly the same performance as the rest of the active pixels.

In some suitable embodiments, the SN in each of the plurality of active pixels comprises a floating diffusion capacitor. In some other embodiments, the SN further comprises a diode. In some suitable embodiments, the plurality of transistors in each of the plurality of active pixels are used for at least one of the following: transferring photo-generated charges to the SN of a corresponding CMOS or other suitable photodiode, resetting the photodiode for receiving a new exposure, resetting the SN of the corresponding CMOS or other suitable photodiode for receiving photo-generated charges from the new exposure, and enabling an active pixel for signal output.

In some suitable embodiments, the vertical shift register (VSR) 104 is configured to perform at least one of the following functions, including receiving a row address of the pixel array 102 from the timing generator 110, and driving controlling lines of the pixel array 102. In some suitable embodiments, the horizontal shift register (HSR) 106 is configured to perform reading out output signals column by column. For example, the VSR 104 and the HSR 106 each is suitably coupled to the pixel array 102. In the illustrated embodiment, the HSR 106 is coupled to the pixel array 102 through the noise canceler 108, wherein the noise canceller 108 is a circuit or the like that removes noise from output signals.

In some suitable embodiments, the timing generator 110 generates a clock signal or the like to synchronize the output signals from the pixel array 102. The auto gain control (AGC) 116 may be a system, circuit or the like to tune an amplitude of the output signals. In the illustrated embodiment, the AGC 116 is coupled to the AGC logic 112 which may provide control to the AGC 116. In some suitable embodiments, the AGC 116 is further coupled to the D/A convertor 114, which converts digital signals to analog signals. Suitably, the AGC 116 may further be coupled to the pixel array 102, the VSR 104, the HSR 106 and the noise canceller 108. In the illustrated embodiment, the AGC 116 is coupled to the A/D convertor 118, which converts analog signals to digital signals. In some suitable embodiments, the voltage regulator 120 is coupled to the pixel array 102, the VSR 104, the HSR 106 and the noise canceller 108, for example, to provide voltage control and/or maintain a constant voltage level to the coupled components or elements.

Figure 2A:
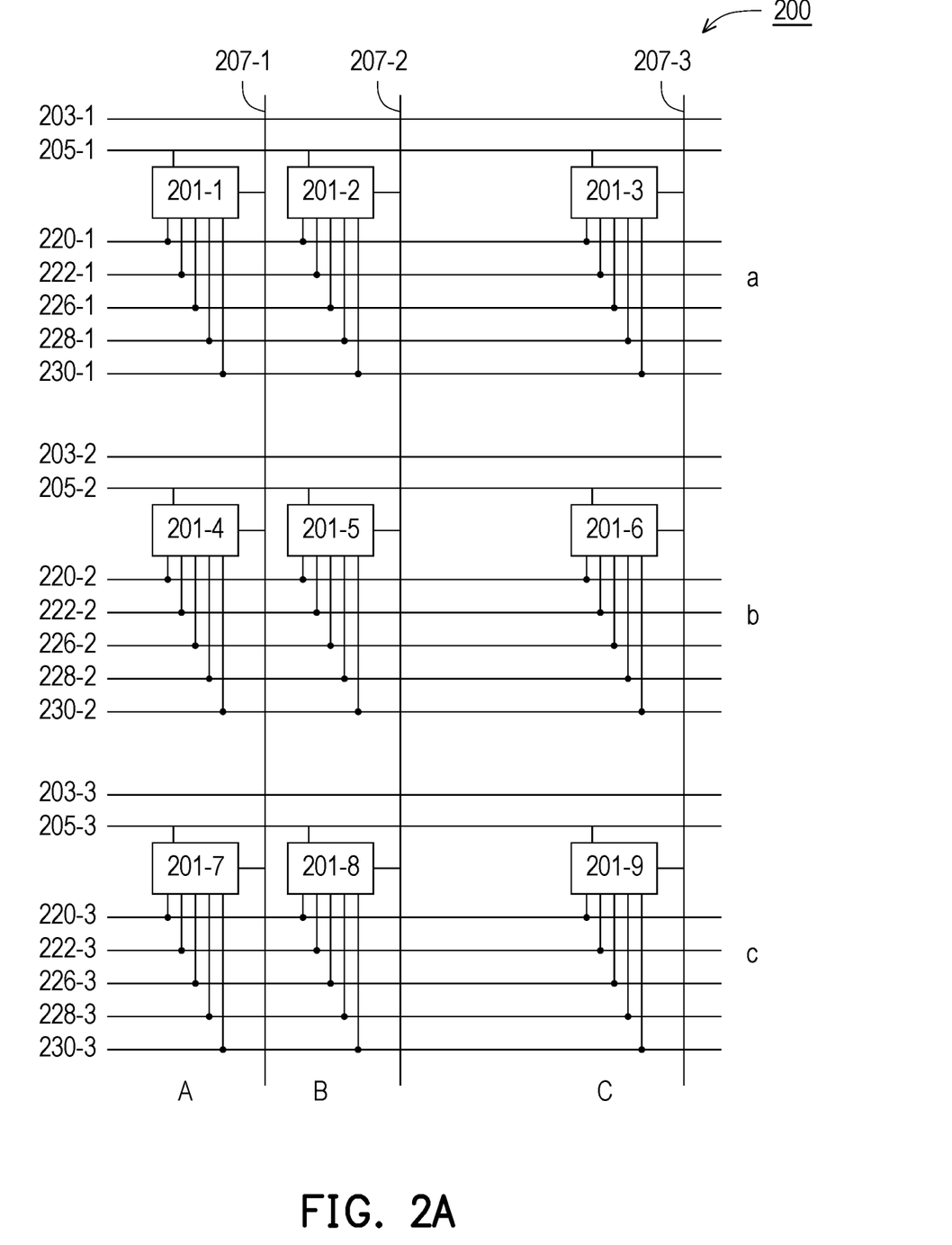
FIG. 2A illustrates a circuit diagram of a pixel array in accordance with some embodiments disclosed herein.
Figure 2B:
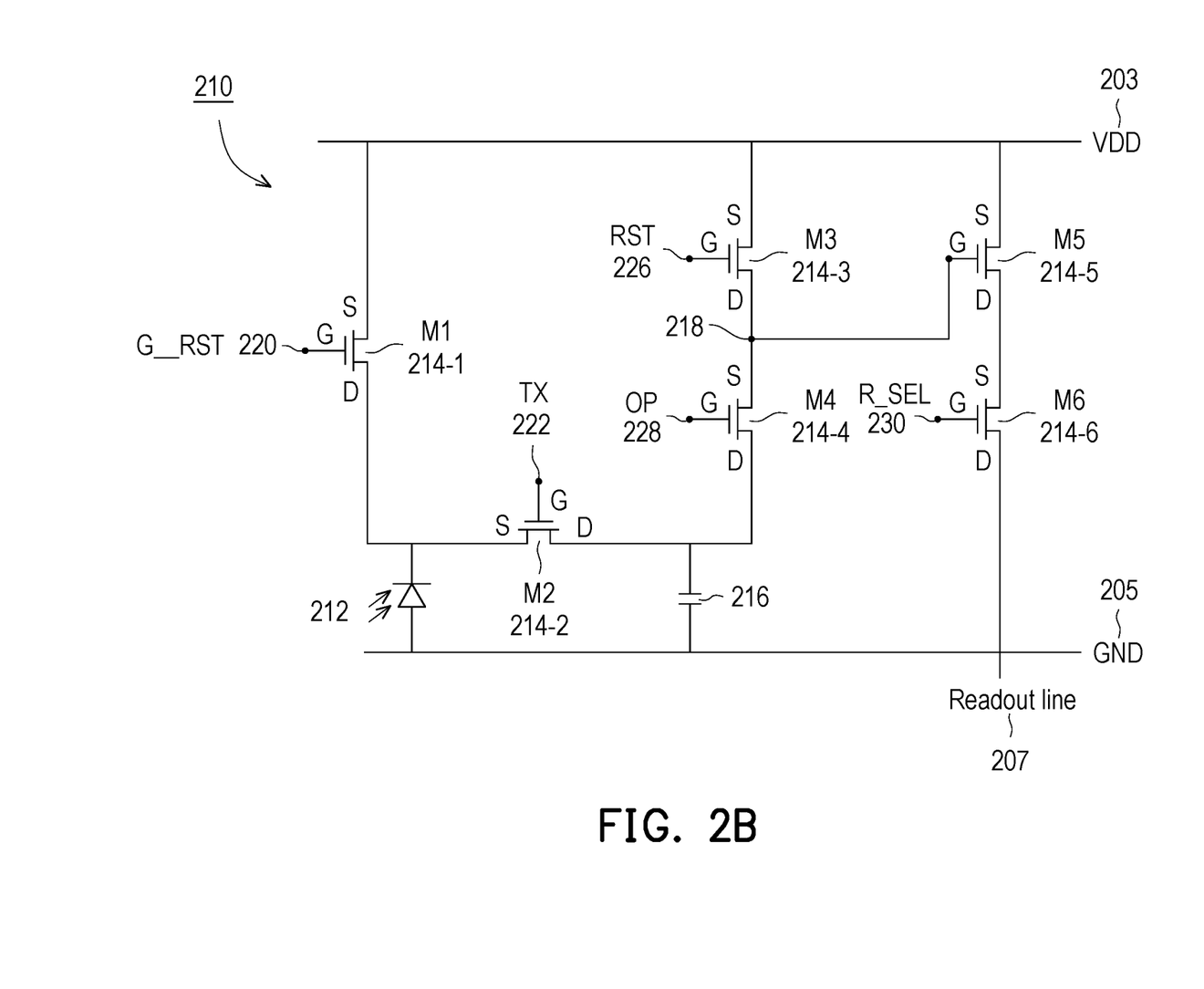
FIG. 2B illustrates a circuit diagram of a pixel in accordance with some embodiments disclosed herein.

With reference now to FIG. 2A, there is illustrated a suitable circuit diagram of a pixel array 200, in accordance with some embodiments of present disclosure. For example, the pixel array 200 illustrated in FIG. 2A may correspond to the pixel array 102 of the CIS 100 shown in FIG. 1. In the illustrated embodiment of FIG. 2A, the pixel array 200 of the CIS 100 includes a plurality of active pixels or cells 201-1, 201-2, 201-3, 201-4, 201-5, 201-6, 201-7, 201-8, and 201-9. For simplicity herein, only 9 active pixels or cells are shown in FIG. 2A. However, in practice, any desired number of active pixels may be included in the pixel array 200 while remaining within the scope of the present disclosure. As described above, the active pixels or cells 201-1, 201-2, 201-3, 201-4, 201-5, 201-6, 201-7, 201-8, and 201-9, are arranged in a matrix of columns (designated by reference characters A, B and C) and rows (designated by reference characters a, b and c). More specifically, in some embodiments, the pixel array 200 includes voltage control lines, for example, from the vertical shift register (VSR) 104, and readout lines 207-1, 207-2, and 207-3. In some embodiments, the pixel array 200 also includes a positive supply voltage power (VDD) 203-1, 203-2, and 203-3, and a zero voltage reference (GND) 205-1, 205-2, and 205-3. As such, the pixel array 200 may include a first plurality of columns (for example, arranged vertically), and a second plurality of rows (for example, arranged horizontally), wherein each column includes a respective pair of VDD 203 and GND 205, and corresponding readout line 207, and each row includes a respective VDD 203, GND 205, and voltage control lines, i.e., G_RST 220, TX 222, RST 226, OP 228 and R_SEL 230. In the illustrated embodiments, the 9 cells or pixels 201 in the pixel array 200 each may also provide corresponding data outputs directly through corresponding readout line 207.

For example, as shown in the illustrated embodiment of FIG. 2A, the pixel array 200 includes columns "A," "B," and "C," and rows "a," "b," and "c," wherein column A includes respective readout line 207-1; column B includes respective readout line 207-2; column C includes respective readout line 207-3; row a includes a respective VDD 203-1, GND 205-1, and voltage control lines 220-1, 222-1, 226-1, 228-1 and 230-1; row b includes a respective VDD 203-2, GND 205-2, and voltage control lines 220-2, 222-2, 226-2, 228-2 and 230-2; and row c includes a respective VDD 203-3, GND 205-3, and voltage control lines 220-3, 222-3, 226-3, 228-3 and 230-3. For simplicity herein, only 3 columns and 3 rows are shown in FIG. 2A. However, in practice, any desired number of columns and/or rows of active pixels may be included in the pixel array 200 while remaining within the scope of the present disclosure.

In the illustrated embodiment, each row comprises 5 control lines, G_RST 220, RST 226, OP 228, TX 222, and R_SEL 230. In some suitable embodiments, as discussed in detail below, the 5 control lines are to provide control signals to the gates of five transistors in each of the pixels of the corresponding row. Specifically, row a includes a respective G_RST 220-1, RST 226-1, OP 228-1, TX 222-1, and R_SEL 230-1; row b includes a respective G_RST 220-2, RST 226-2, OP 228-2, TX 222-2, and R_SEL 230-2; and row c includes a respective G_RST 220-3, RST 226-3, OP 228-3, TX 222-3, and R_SEL 230-3.

As described above, each active cell or pixel of the pixel array 200 (for example, 201-1, 200-2, 201-3, 201-4, 200-5, 201-6, 200-7, 201-8, 201-9, etc.) may include a plurality of transistors, which is discussed in greater detail below with reference to FIG. 2B. It should be also noted that FIG. 2A is only an example for illustration purposes and is not intended to be limiting. The type of signal lines in a pixel array 200 in this present disclosure can be arranged in different ways depending on the circuit layout design and types of bit cells used in the array.

With reference now to FIG. 2B, there is illustrated a circuit diagram of an active pixel 210, for example, in the pixel array 200, in accordance with some embodiments of the present disclosure. For example, the active pixel 210 shown in FIG. 2B may correspond to any one or more of the active pixels or cells 201-1, 201-2, 201-3, 201-4, 201-5, 201-6, 201-7, 201-8 or 201-9 shown in FIG. 2A.

In the illustrated embodiment of FIG. 2B, the active pixel 210 comprises a photodiode 212, and 6 transistors M1-M6, namely, transistor M1 214-1, transistor M2 214-2, transistor M3 214-3, transistor M4 214-4, transistor M5 214-5, and transistor M6 214-6. In some embodiments, each of the 6 transistors in the active pixel 210 comprises a p-type metal-oxide-semiconductor (PMOS) transistor. Although the illustrated embodiment of FIG. 2B shows that transistors M1-M6 are PMOS transistors, any of a variety of transistors or other like devices that are suitable for use in a memory or other like device may be implemented as at least one of the transistors M1-M6 such as, for example, an n-type metal-oxide-semiconductor (NMOS) transistor, a bipolar junction transistor (BJT), a high-electron mobility transistor (HEMT), etc.

In some suitable embodiments, the active pixel 210 may further include a capacitor 216, for example, which effectively serves as the local SN of the active pixel 210. In some embodiments, the transistors M1 214-1 and M3 214-3 are reset transistors. In some embodiments, the transistor M1 214-1 is a global reset gate and the transistor M3 214-3 is a reset gate.

In some suitable embodiments, the source terminals of the transistors M1 214-1, M3 214-3 and M5 214-5 are coupled to VDD 203. The drain terminal of the transistor M1 214-1 is further coupled to the photodiode 212, wherein one of the terminals of the photodiode 212 is coupled to GND 205. The drain terminal of the transistor M1 214-1 is further coupled to the source terminal of the transistor M2 214-2. The drain terminals of the transistors M2 214-2 and M4 214-4 are coupled together to GND through the capacitor 216. The drain terminal of the transistor M3 214-3 and the source terminal of the transistor M4 214-4 are coupled together at node 218. The drain terminal of the transistor M5 214-5 and source terminal of the transistor M6 214-6 are coupled together. In some suitable embodiments, gate terminal of the transistor M5 214-5 is coupled to the node 218. The drain terminal of the transistor M6 214-6 is coupled to the readout line 207. The gate terminals of the transistors M1 214-1, M2 214-2, M3 214-3, M4 214-4 and M6 214-6 are coupled to a first control line (G_RST) 220, a second control line (TX) 222, a third control line (RST) 226, a fourth control line (OP) 228, and a fifth control line (R_SEL) 230, respectively.

In some suitable embodiments, when sensing for example, a voltage on the G_RST control line 220 switching from low to high turns on the transistor M1 214-1 so as to reset the photodiode 212. The photodiode 212 then receives light signals and photon-induced charge carriers are generated within the photodiode 212. The voltage on the TX control line 222 is then switched from low to high so as to turn on the transistor M2 214-2, while the voltage on the OP control line 228 is kept low so as to turn off the transistor M4 214-4. The photon-inducted charge carriers are then directed to the capacitor 216 (for example, which effectively acts as the SN of the active pixel 210) through the transistor M2 214-2. In some suitable embodiments, as discussed in greater detail below, the capacitor 216 is suitably covered and/or otherwise protected by a light-shielding structure to inhibit and/or guard against light induced noise.

In some suitable embodiments, when reading a background signal for example, the voltage on the OP control line 228 is kept low to keep the transistor M4 214-4 off and the voltage on the RST control line 226 is switched from low to high so as to turn on the transistor M3 214-3, which pulls up the voltage level at the node 218 from low to high. The voltage on the node 218 is then able to turn on the transistor M5 214-5. The voltage on the R_SEL control line 230 is then switched from low to high so as to read a background signal to the readout line 207.

In some suitable embodiments, when reading the stored photo-inducted charge carriers out to the readout line 207 for example, the voltage on the RST control line 226 is then switched from high to low; the voltage on the OP control line 228 is switched from low to high; and the voltage on the R_SEL control line 230 is kept high so as to read out the signal stored on the SN to the readout line 207.

The layout, arrangement and/or structure of selected portions, elements and/or components of an active pixel, for example, such as the active pixel 210 shown in FIG. 2B, are shown in FIGS. 3-9. For ease of reference and illustrative purposes herein, in FIGS. 3-9, the various elements and/or components depicted therein are shown relative to an otherwise arbitrarily chosen three-dimensional (3D) cartesian coordinate system including X, Y and Z axes as shown in the FIGURES. While consistency is maintained among and/or across the various FIGURES (unless otherwise explicitly noted), it is to be appreciated the directions and/or orientations indicated by these axes are chosen primarily for the purpose of facilitating the description provided herein, for example, to describe and/or identify relative orientations and/or directions. Unless otherwise indicated, the illustrated coordinate system and/or axes, in and of themselves, are not intended to be limiting and should not be read or interpreted as such.

Figure 3:
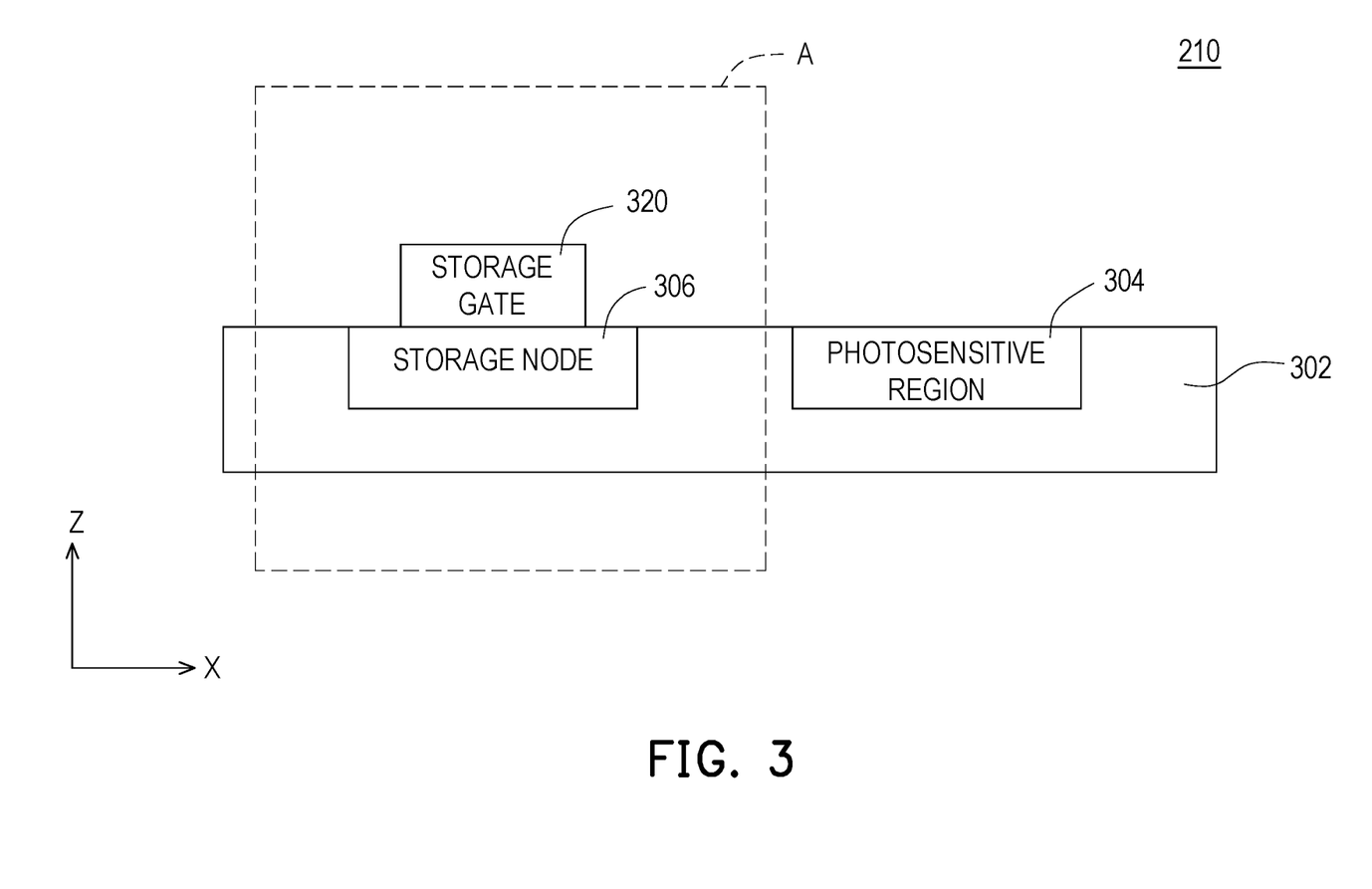
FIG. 3 is a diagrammatic illustration showing a partial cross-section view of a pixel in accordance with some embodiments disclosed herein.

In particular, FIG. 3 is a partial cross-section view showing the layout, structure and/or arrangement of selected elements and/or components comprising the active pixel 210 in accordance with some suitable embodiments described herein. As shown in FIG. 3, the active pixel 210 includes a pixel region (for example, comprising the photodiode 212 shown in FIG. 2B), a storage region (for example, also referred to as the SN and comprising the capacitor 216 shown in FIG. 2B) and a storage gate structure formed on or over the storage region. As described below and/or shown in later FIGURES, in some suitable embodiments a light-shielding structure covers and/or protects the storage region and/or the storage gate structure, for example, to inhibit unwanted stray light from entering the storage gate structure and/or the storage region.

Referring to FIG. 3, a substrate 302 is provided, in which the photosensitive pixel region 304 and storage region or SN 306 are formed. In some suitable embodiments, the substrate 302 may be made of silicon or other semiconductor materials. In some embodiments, the substrate 302 is a wafer. Alternatively or additionally, the substrate 302 may include other elementary semiconductor materials such as germanium. In some embodiments, the substrate 302 is made of a compound semiconductor or alloy semiconductor, such as silicon carbide, gallium arsenic, indium arsenide, or indium phosphide, silicon germanium, silicon germanium carbide, gallium arsenic phosphide, or gallium indium phosphide. In some embodiments, the substrate 302 includes an epitaxial layer. For example, the substrate 302 may have an epitaxial layer overlying a bulk semiconductor.

As previously mentioned, the active pixel 210 may include a pixel region 304 and a storage region 306 formed in the substrate 302. In practice, the storage region 306 may comprise and/or be referred to as the SN, for example, including the capacitor 216 shown in FIG. 2B, or another like or suitable charge storage element. The pixel region 304 (also referred to as the photosensitive region) suitably includes photosensitive elements, for example such as the photodiode 212 shown in FIG. 2B. More generally, the photosensitive elements may include a photodiode, a partially pinned photodiode, a pinned photodiode, or a photo-capacitor. In some suitable embodiments, the pixel region 304 may be a doped region doped with n-type and/or p-type dopants. In some suitable embodiments, the pixel region 304 may be formed by an ion implantation process, a diffusion process or another applicable process. In some suitable embodiments, the storage region 306 is formed, arranged and/or located adjacent to the pixel region 304. In practice, the storage region or SN 306 comprises, for example, the capacitor 216 shown in FIG. 2B or another like or suitable storage element, and is configured to temporarily store a charge. Suitably, the storage region or SN 306 should not be exposed to incoming light. In some suitable embodiments, the storage region or SN 306 may be a doped region doped with n-type and/or p-type dopants. In some suitable embodiments, the storage region or SN 306 may be formed by an ion implantation process, a diffusion process or another applicable process.

In some suitable embodiments, the gate structure 320 is formed on and/or over the SN 306 and may include a gate dielectric layer and a gate electrode layer formed thereover. A pair of gate spacer layers may be formed on sidewall surfaces of the gate structure 320. The gate dielectric layer may be a single layer or multiple layers. In some suitable embodiments, the gate dielectric layer may be made of silicon oxide ($SiO_x$), silicon nitride ($Si_xN_y$), silicon oxynitride (SiON), dielectric material(s) with a high dielectric constant (high-k), or a combination thereof. In some embodiments, the gate dielectric layer may be formed by a deposition process, such as a chemical vapor deposition (CVD) process, a plasma enhanced chemical vapor deposition (PECVD) process, a spin coating process or another applicable process. For example, the gate electrode layer may be made of a suitable conductive material, such as aluminum (Al), copper (Cu), tungsten (W), titanium (Ti), tantalum (Ta), or another applicable material. In some suitable embodiments, the gate electrode layer may be formed by a deposition process, such as chemical vapor deposition (CVD), physical vapor deposition (PVD), atomic layer deposition (ALD), or another applicable process. Suitably, the gate spacer layers may be made of silicon oxide, silicon nitride, silicon oxynitride or another applicable material. In some embodiments, the gate spacers are formed by a chemical vapor deposition (CVD) process, a physical vapor deposition (PVD) process, or another applicable process. While FIG. 3 shows the gate structure 320 for and/or associated with the storage region or SN 302, in practice, a similar such gate structure or another like or suitable gate structure may be employed as the gate or gate terminal of any one or more of the transistors M1 214-1, M2 214-2, M3 214-3, M4 214-4 and M6 214-6.

Figure 4:
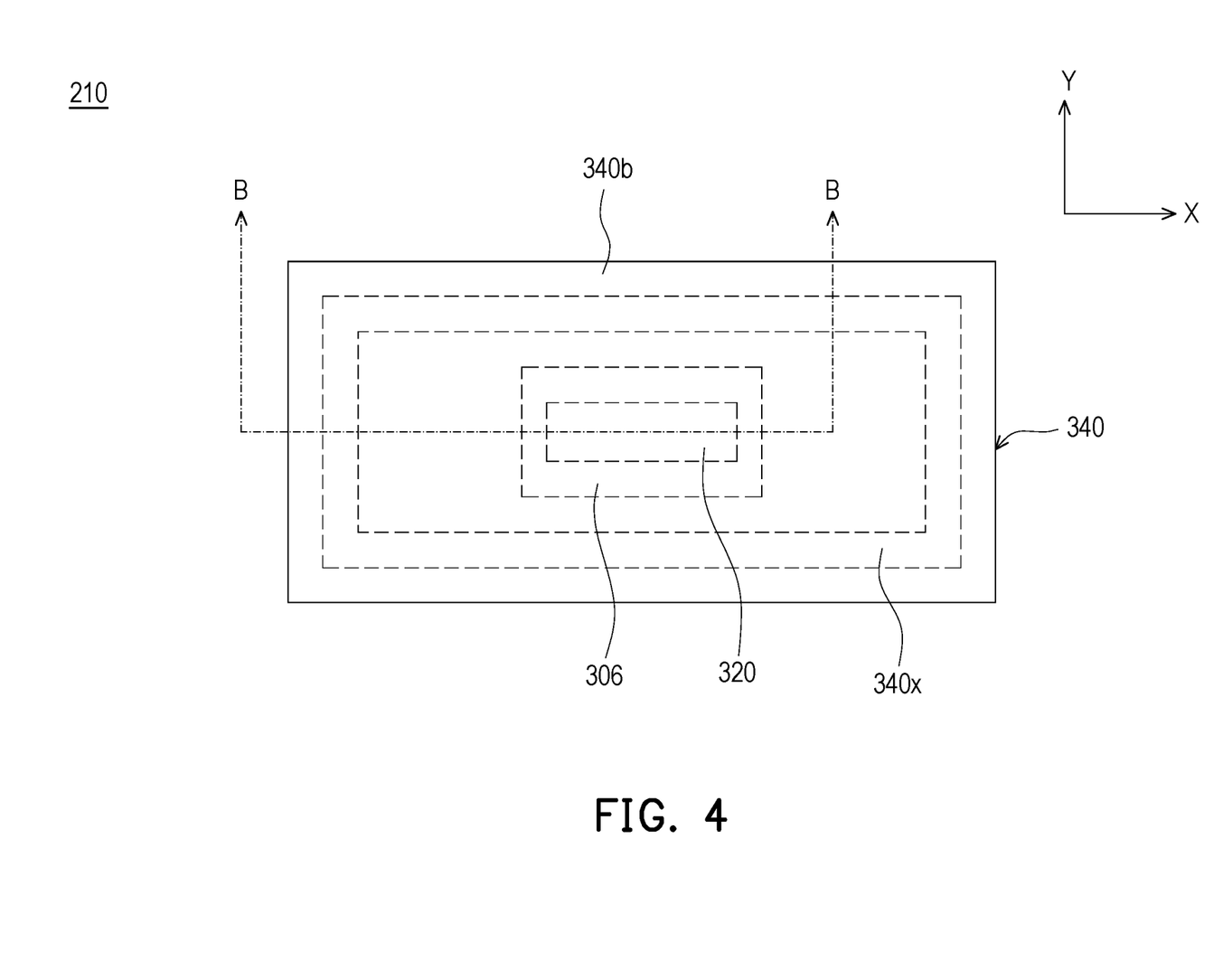
FIG. 4 is a diagrammatic illustration showing a partial top view of a pixel in accordance with some embodiments disclosed herein

With reference now to FIG. 4, there is shown a top view of the portion A of the active pixel 210 shown in FIG. 3, with a light-shielding structure 340 having been formed on and/or over the memory region or SN 306 and storage gate structure 320. FIGS. 5-9 illustrate cross-sectional views of the portion A of the active pixel 210 taken along a section line B-B shown in FIG. 4, in accordance with various suitable embodiments disclosed herein. In FIG. 4, selected elements, components and/or structures (for example, the storage region or SN 306, the storage gate structure 320 and an extension 340x of the light shielding structure 340) underlying a body 340b of the light-shielding structure 340 are depicted with broken lines. As shown, in some suitable embodiments, the light-shield structure 340 includes a main body 340b and an extension 340x which extends therefrom, for example, primarily in a direction of the Z axis. In some suitable embodiments, the extension 340x of the light-shielding structure 340 extends and/or protrudes into the substrate 302, for example, as seen in FIGS. 5-9. As shown in FIG. 4, the extension 340x of the light-shielding structure 340 protruding into the substrate 302 may completely or substantially encircle an outer periphery of the storage region or SN 306, for example, such that the storage region or SN 306 resides and/or is located within the confines of the extension 340x and under the body 340b of the light-shielding structure 340.

Figure 5:
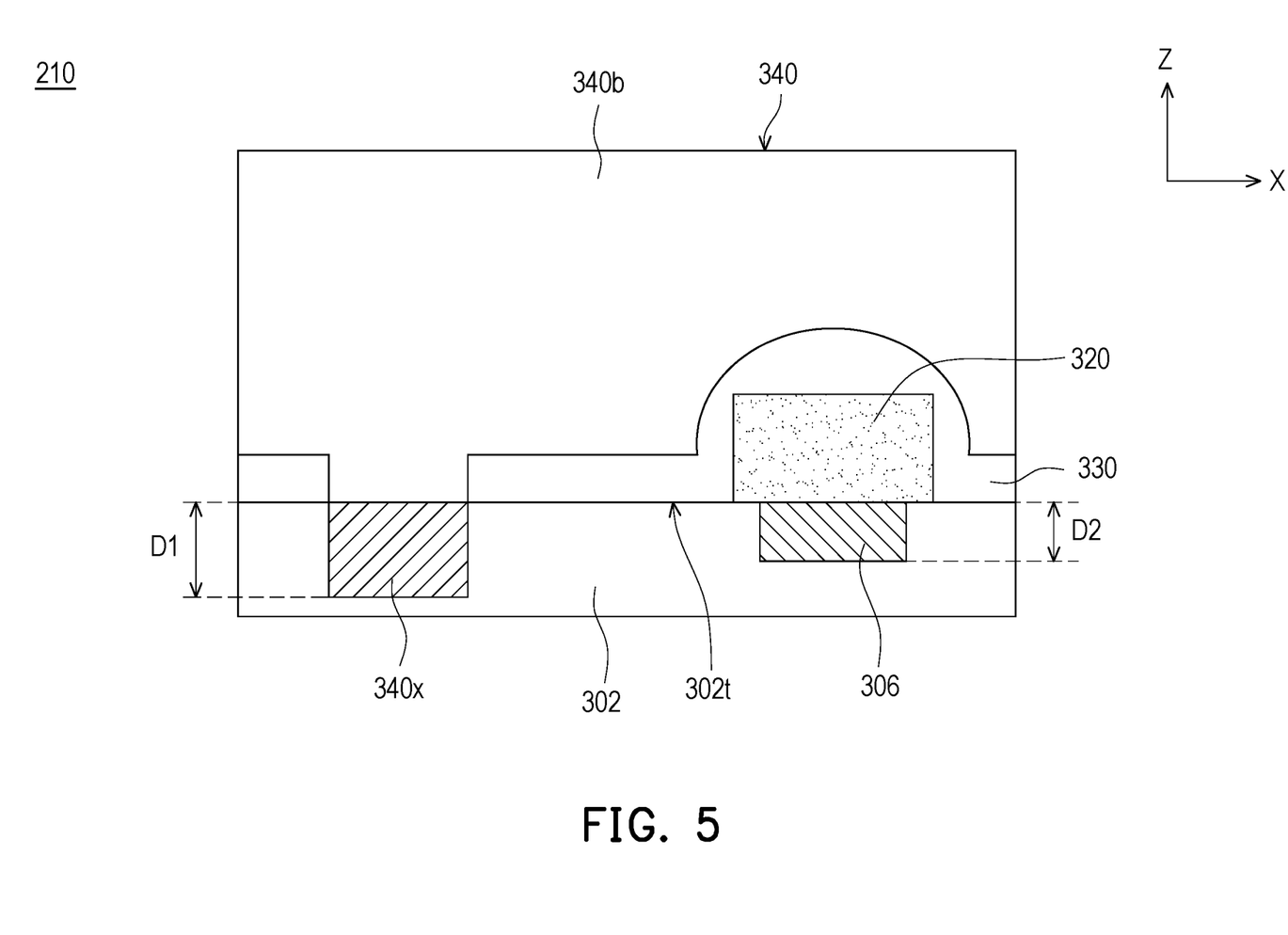
FIG. 5 is a diagrammatic illustration showing a partial cross-section view of a pixel in accordance with some embodiments disclosed herein.

Suitably, as shown in FIG. 5 for example, the extension 340x of the light-shielding structure 340 extends to a depth D1 into the substrate 302, for example, measured in a direction of the Z axis from an upper or top surface 302t of the substrate 302. In some suitable embodiments, the depth D1 is greater than a depth D2 at which the storage region or SN 306 is formed and/or extends into the substrate 302, for example, as measured from the top surface 302t of the substrate 302 in a direction of the Z axis.

In some suitable embodiments, the body 340b of the light-shielding structure 340 and its extension 340x are formed as an integral structure. For example, without limitation, the light-shielding structure 340, including its body 340b and its extension 340x, may be made of and/or formed from tungsten (W), chromium (Cr), chrome, titanium (Ti), alloys thereof and/or other suitable metals and/or alloys. In some embodiments, a suitably patterned mask, for example, such as a hard mask or other like or suitable mask, may be employed and regions or areas of the substrate 302 and/or other layers uncovered and/or otherwise unprotected by the mask may be etched away and/or removed by any suitable etching process or other material removal process, for example, to form a trench or the like in the substrate 302 which is subsequently filled with the material forming the light-shielding structure extension 340x and/or body 340b. Accordingly, the extension 340x of the light-shielding structure 340 essentially forms a substantially vertical wall or barrier or ring within the substrate 302 that surrounds the storage region or SN 306 such that the storage region of SN 306 resides and/or is contained within an inner periphery of the extension 340x.

In some suitable embodiments, a gate shielding layer 330 may be formed on and/or over the gate structure 320, for example, as shown in FIGS. 5-9, between the light-shielding structure 340 and the gate structure 320. In some suitable embodiments, the gate shielding layer 330 may be made of and/or formed from a suitable metal. In some suitable embodiments, the gate shielding layer 330 may be made of and/or formed from, for example, a silicide material.

Figure 6:
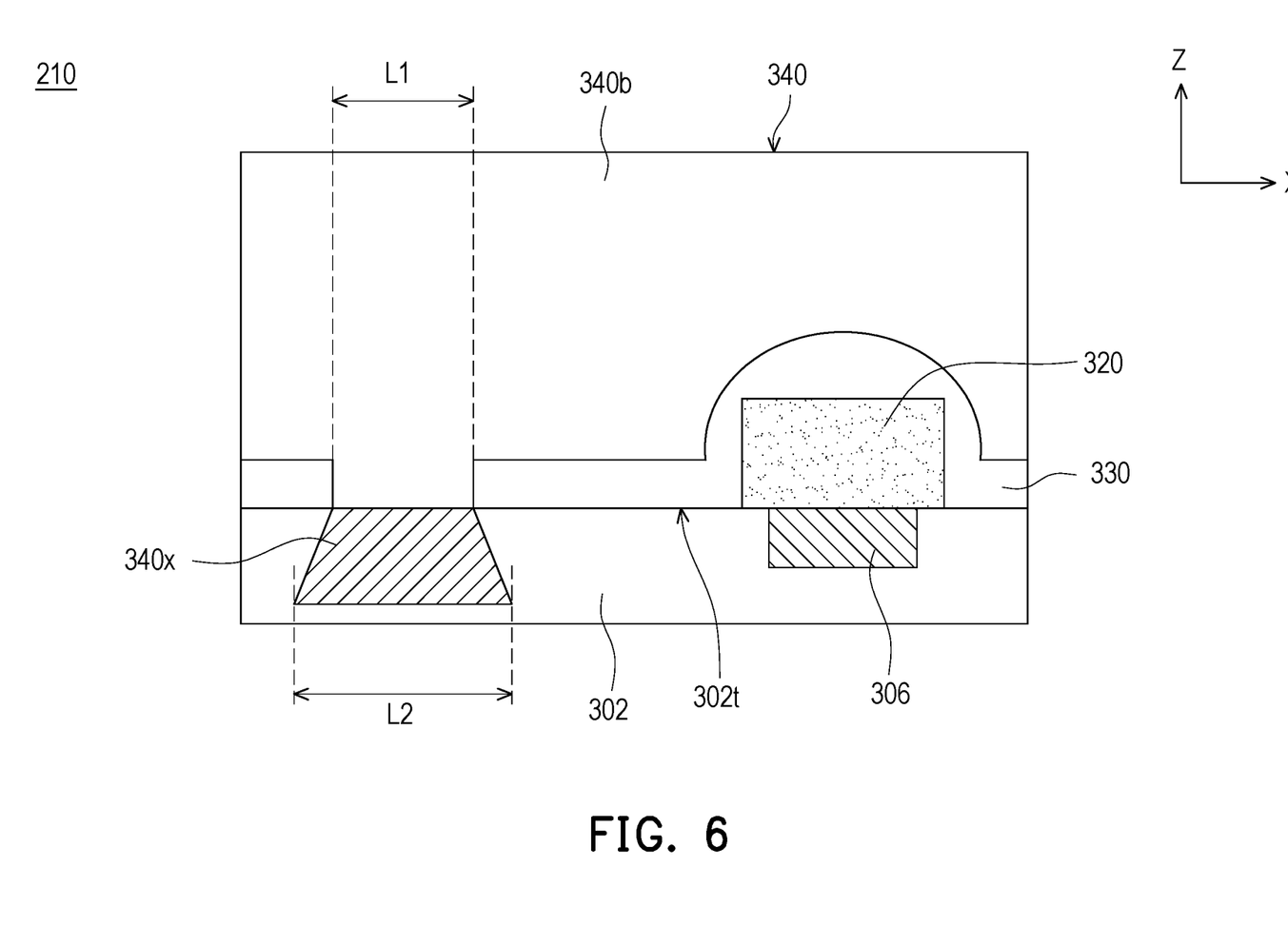
FIG. 6 is a diagrammatic illustration showing a partial cross-section view of a pixel in accordance with some embodiments disclosed herein.
Figure 7:
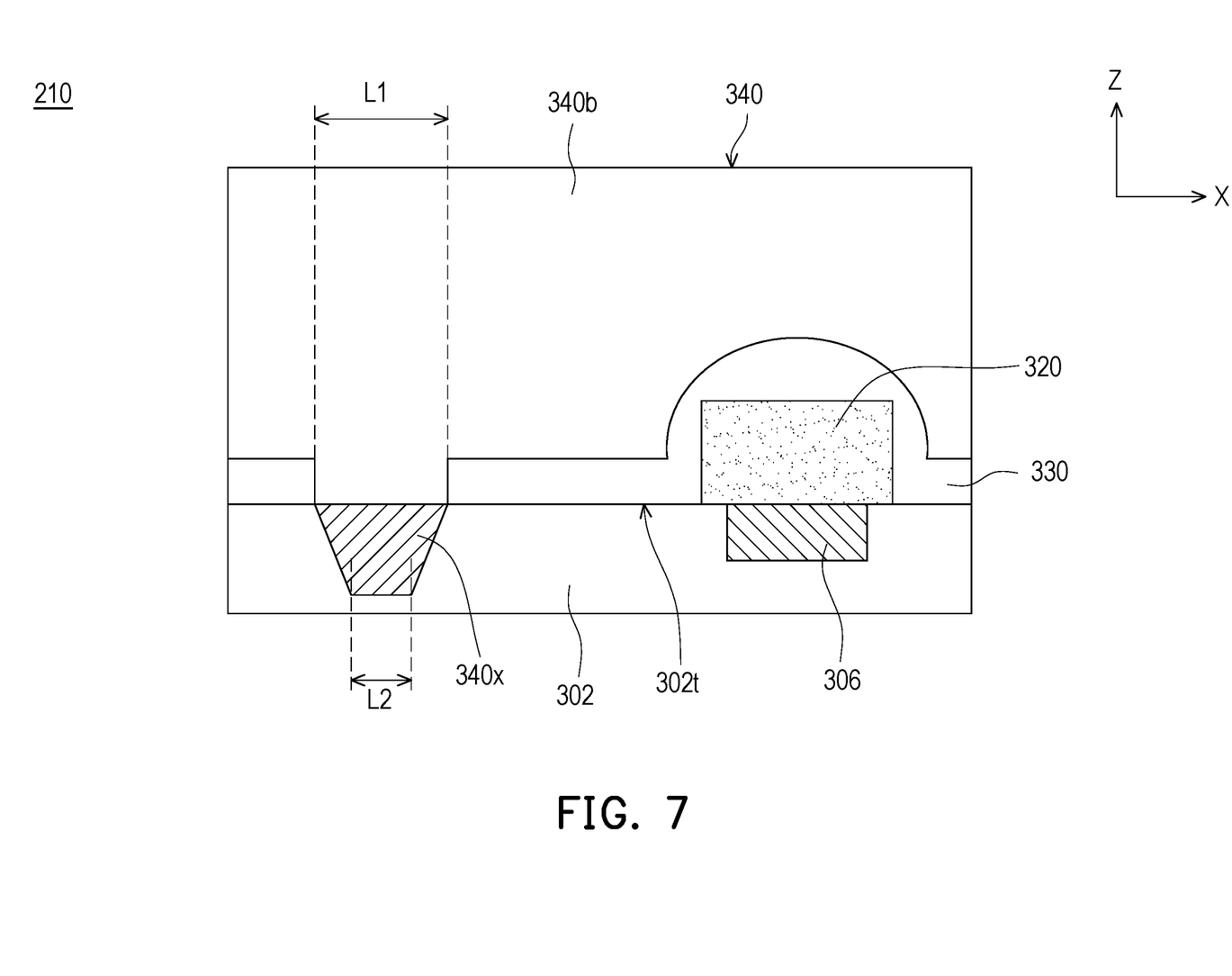
FIG. 7 is a diagrammatic illustration showing a partial cross-section view of a pixel in accordance with some embodiments disclosed herein.
Figure 8:
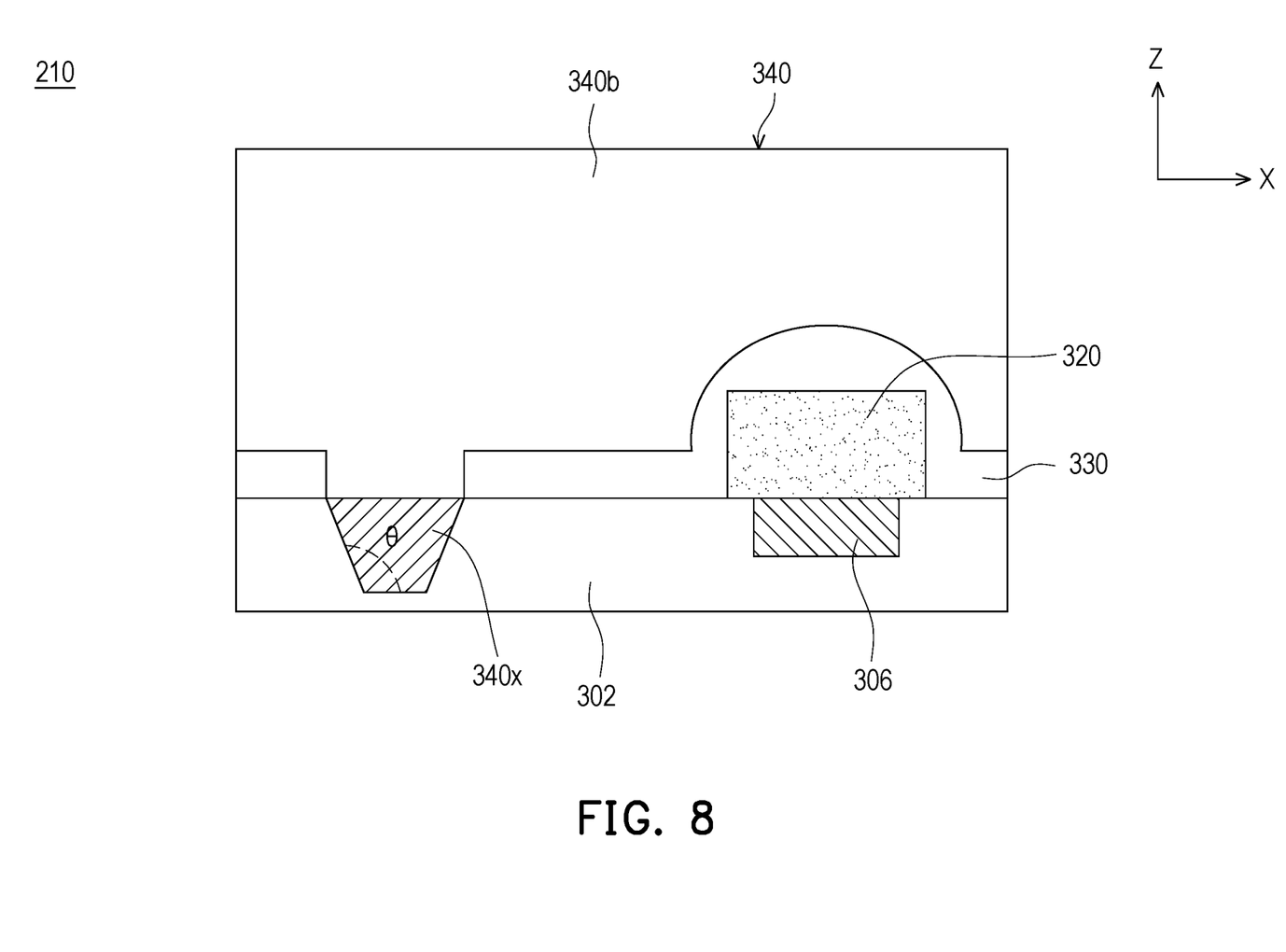
FIG. 8 is a diagrammatic illustration showing a partial cross-section view of a pixel in accordance with some embodiments disclosed herein.
Figure 9:
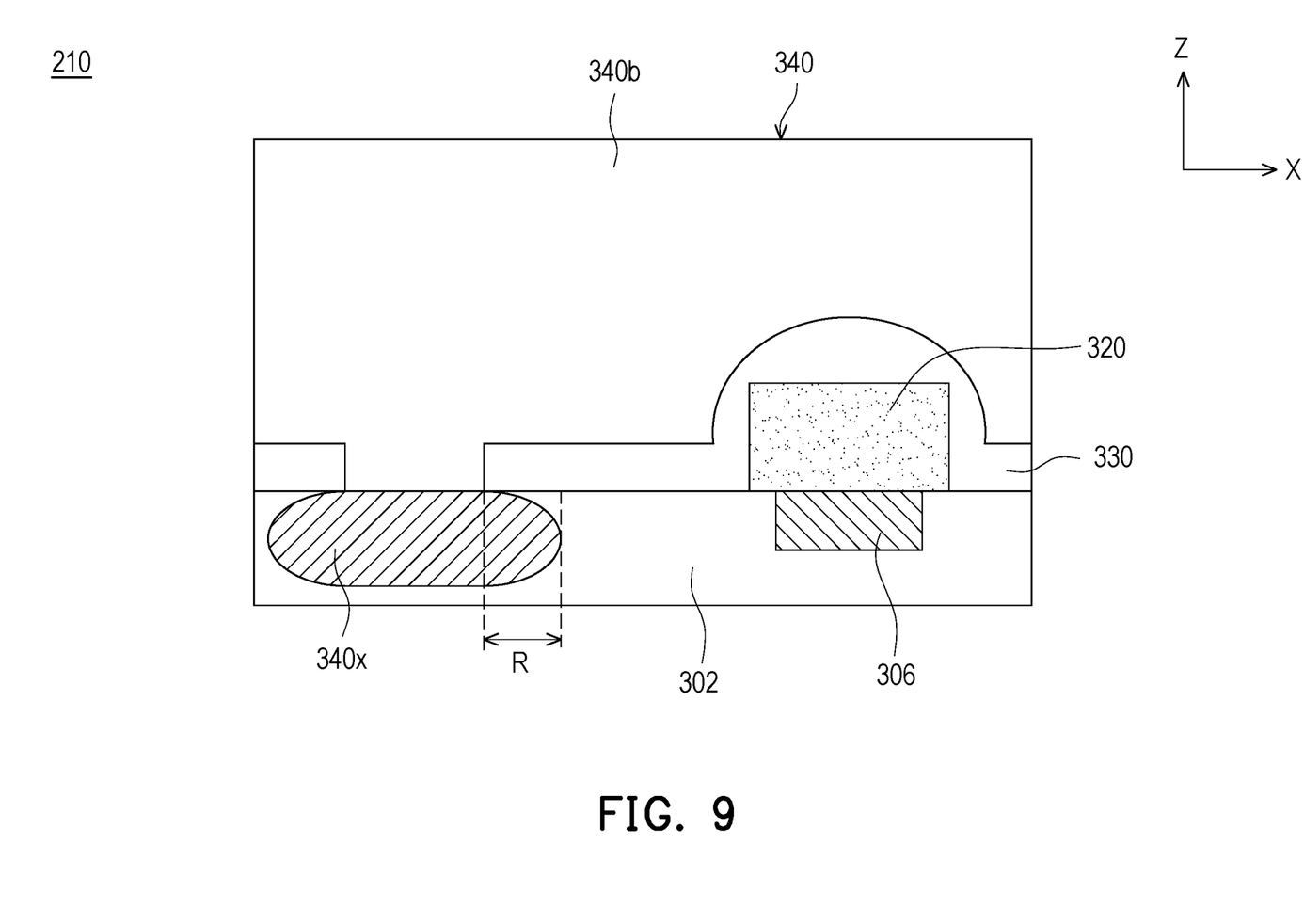
FIG. 9 is a diagrammatic illustration showing a partial cross-section view of a pixel in accordance with some embodiments disclosed herein.

As shown in FIG. 5, in some suitable embodiments, the extension 340x of the light-shielding structure 340 may have essentially parallel vertically extending side walls, for example, such that a width of the extension 340x in a direction of the X axis is essentially uniform. As shown in FIG. 6, in some suitable embodiments, the extension 340x of the light-shielding structure 340 may have sloped or otherwise diverging side walls, for example, such that a width L1 of the extension 340x at or near the surface 302t of the substrate 302 (i.e., proximate to the main body 340b of the light-shielding structure 340) is less than a width L2 of the extension 340x at its ultimate depth into the substrate 302 (i.e., distal from the main body 340b of the light-shielding structure 340), where L1 and L2 are for example measure in a direction of the X axis. As shown in FIG. 7, in some suitable embodiments, the extension 340x of the light-shielding structure 340 may have sloped or otherwise converging side walls, for example, such that the width L1 of the extension 340x at or near the surface 302t of the substrate 302 (i.e., proximate to the main body 340b of the light-shielding structure 340) is greater than the width L2 of the extension 340x at its ultimate depth into the substrate 302 (i.e., distal from the main body 340b of the light-shielding structure 340), where L1 and L2 are for example measure in a direction of the X axis. As shown in FIG. 8, in some suitable embodiments, the extension 340x of the light-shielding structure 340 may have sloped side walls, for example, such that the side walls form an angle θ with respect to a horizontal or X-Y plane. As shown in FIG. 9, in some suitable embodiments, the extension 340x may additionally extend horizontally or laterally through the substrate 302, for example, by an amount or distance R in a direction of the X axis.

Figure 10:
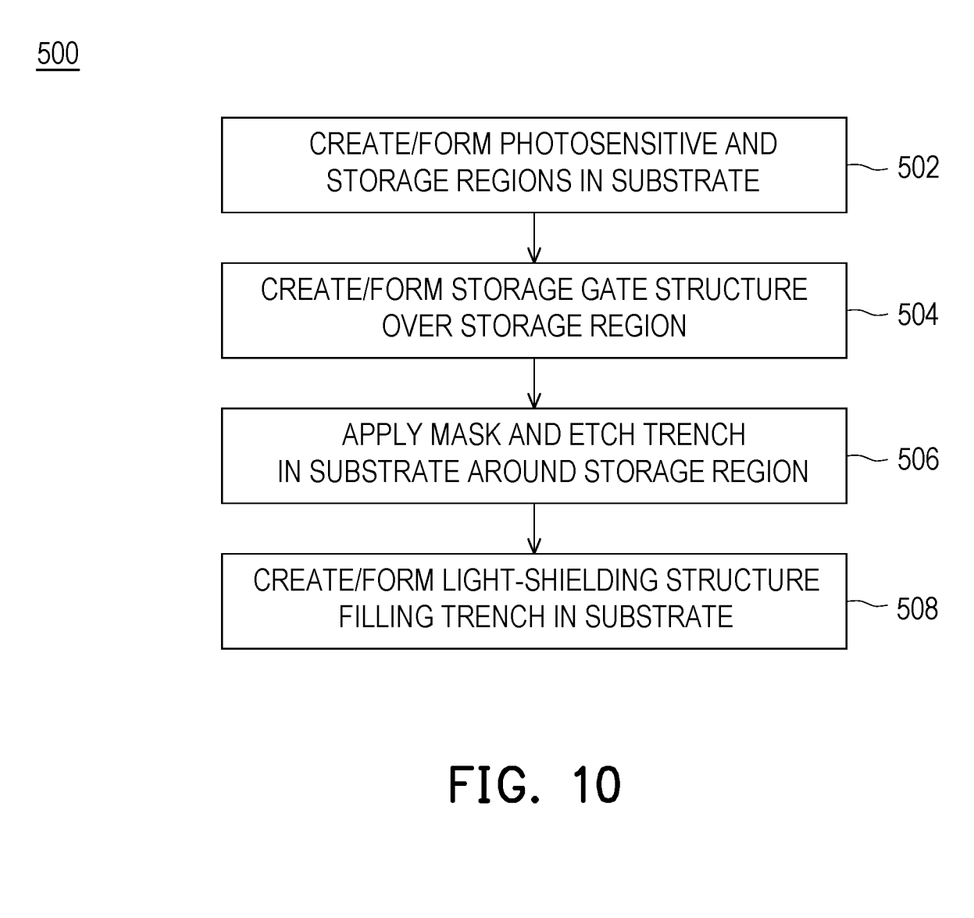
FIG. 10 is a flow chart showing a process for forming and/or manufacturing a pixel in accordance with some embodiments disclosed herein.

With reference now to FIG. 10, there is illustrate a flow chart showing a suitable process and/or method 500 for forming and/or manufacturing a pixel, for example, such as the pixel 210, in accordance with some embodiments disclosed herein.

In some suitable embodiments, the process or method 500 begins at step 502 with the forming or creating of the photosensitive region 304 (for example, including the photodiode 212) and the SN 306 (for example, including the capacitor 216) in the substrate 302. Then, at step 504, the storage gate structure 320 is formed or created on and/or over the SN 306. In some suitable embodiments, at step 506, a suitable mask is applied and a trench is etched or otherwise formed or created in the substrate 302 around the SN 306. Then, at step 508, the light-shielding structure 340 is formed and/or created, for example, by a suitable metallization process or the like which also fills the trench to form the extension 340x. For example, the metallization may be part of back end of line (BEOL) processing.

In the following, some further illustrative embodiments are described.

In some embodiments, a pixel of an image sensor includes: a semiconductor material substrate; a photosensitive region formed in the substrate, the photosensitive region generating photo-induced electrical charge in response to illumination with light; a storage node formed in the substrate proximate to the photosensitive region, the storage node selectively receiving and storing photo-induced electrical charge generated by the photosensitive region; and a shield formed over the storage node which inhibits light from reaching the storage node, the shield including an extension which protrudes into the substrate and surrounds an outer periphery of the storage node.

In some further embodiments, the extension extends into the substrate to a depth greater than where the storage node is formed in the substrate.

In still additional embodiments, the photosensitive region comprises a photodiode and the storage node comprises a capacitor.

In some embodiments, the pixel further includes a gate structure formed between the shield and the storage node, the gate structure serving as a gate terminal of a transistor which regulates an operation of the storage node.

In yet further embodiments, the extension has a first width at a first end thereof which is proximate to a surface of the substrate where the extension enters the substrate and second width at a second end thereof which is distal from the surface of the substrate, the second width being one of greater than, less than or equal to the first width.

In some further embodiments, the image sensor is a global shutter complementary metal-oxide semiconductor image sensor.

In some embodiments, the shield is formed from a light-blocking material.

In yet further embodiments, the light blocking material is one of tungsten, chromium, titanium, a metal or a metal alloy.

In some embodiments, an image sensor including: an array of pixels, each pixel having an associated photosensitive region and storage node formed in a substrate, the photosensitive region generating electrical charge in response to illumination with light and the storage node selectively receiving and storing electrical charge generated by its associated photosensitive region; and a light-shielding structure formed over the storage node of each pixel, the light-shielding structure inhibiting light from impinging on the storage node over which it is formed, the light-shielding structure including a main body which overlays the storage node and a portion extending from the main body vertically into the substrate, which portion encircles the storage node.

In some further embodiments, the portion of the light-shielding structure extending into the substrate extends into the substrate deeper than where the storage node resides in the substrate.

In still further embodiments, the photosensitive region comprises a photodiode and the storage node comprises a capacitor.

In yet additional embodiments, the image further includes a gate structure formed between the main body of the light-shielding structure and the storage node for each pixel, the gate structure serving as a gate terminal of a transistor which regulates an operation of the storage node.

In some further embodiments, the portion of the light-shielding structure extending into the substrate has a first width at a first end thereof which is proximate to the main body of the light-shield structure and a second width at a second end thereof which is distal from the main body of the light shielding structure, the second width being one of greater than, less than or equal to the first width.

In some additional embodiments, the image sensor is a global shutter image sensor.

In some embodiments, the image sensor is a complementary metal-oxide semiconductor (CMOS) image sensor (CIS).

In some embodiments, the light-shielding structure is formed from a light-blocking material including at least one of tungsten, chromium, titanium, a metal or a metal alloy.

In some further embodiments, a method of manufacturing a global shutter (GS) complementary metal-oxide semiconductor (CMOS) image sensor (CIS) is provided. The method includes: creating a photosensitive region for a pixel of the GS CIS in a semiconductor substrate, the photosensitive region generating a charge in response to illumination by light; creating a storage node for the pixel in the semiconductor substrate, the storage node receiving the generated charge from the photosensitive region created for the pixel; and creating a light shield over the storage node, the light shield including an extension extending therefrom which protrudes into the substrate and surrounds the storage node.

In still further embodiments, the method further includes etching a trench in the substrate around the storage node; and filling the trench with a light blocking material used to create the light shield.

In yet further embodiments, creating the photosensitive region includes creating a photodiode and creating the storage node includes creating a capacitor.

In still one more embodiment, the method further includes creating a gate structure over the storage node, the gate structure residing under the light shield and serving as a gate terminal of a transistor which regulates an operation of the storage node.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A pixel of an image sensor comprising:
   a semiconductor material substrate;
   a photosensitive region formed in the substrate, the photosensitive region generating photo-induced electrical charge in response to illumination with light;
   a storage node formed in the substrate proximate to the photosensitive region, the storage node selectively receiving and storing photo-induced electrical charge generated by the photosensitive region; and
   a shield formed over the storage node which inhibits light from reaching the storage node, the shield including an extension which protrudes into the substrate and surrounds an outer periphery of the storage node,
   wherein the extension extends into the substrate to a depth greater than where the storage node is formed in the substrate.

2. The pixel of claim 1, wherein the photosensitive region comprises a photodiode and the storage node comprises a capacitor.

3. The pixel of claim 1, further comprising:
   a gate structure formed between the shield and the storage node, the gate structure serving as a gate terminal of a transistor which regulates an operation of the storage node.

4. The pixel of claim 1, wherein the extension has a first width at a first end thereof which is proximate to a surface of the substrate where the extension enters the substrate and second width at a second end thereof which is distal from the surface of the substrate, the second width being one of greater than, less than or equal to the first width.

5. The pixel of claim 1, wherein the image sensor is a global shutter complementary metal-oxide semiconductor image sensor.

6. The pixel of claim 1, wherein the shield is formed from a light-blocking material.

7. The pixel of claim 6, wherein the light blocking material is one of tungsten, chromium, titanium, a metal or a metal alloy.

8. An image sensor comprising:
   an array of pixels, each pixel having an associated photosensitive region and storage node formed in a substrate, the photosensitive region generating electrical charge in response to illumination with light and the storage node selectively receiving and storing electrical charge generated by its associated photosensitive region; and
   a light-shielding structure formed over the storage node of each pixel, the light-shielding structure inhibiting light from impinging on the storage node over which it is formed, the light-shielding structure including a main body which overlays the storage node and a portion extending from the main body vertically into the substrate, which portion encircles the storage node,
   wherein the portion of the light-shielding structure extending into the substrate extends into the substrate deeper than where the storage node resides in the substrate.

9. The image sensor of claim 8, wherein the photosensitive region comprises a photodiode and the storage node comprises a capacitor.

10. The image sensor of claim 8, further comprising:
    a gate structure formed between the main body of the light-shielding structure and the storage node for each pixel, the gate structure serving as a gate terminal of a transistor which regulates an operation of the storage node.

11. The image sensor of claim 8, wherein the portion of the light-shielding structure extending into the substrate has a first width at a first end thereof which is proximate to the main body of the light-shield structure and a second width at a second end thereof which is distal from the main body of the light shielding structure, the second width being one of greater than, less than or equal to the first width.

12. The image sensor of claim 8, wherein the image sensor is a global shutter image sensor.

13. The image sensor of claim 8, wherein the image sensor is a complementary metal-oxide semiconductor (CMOS) image sensor (CIS).

14. The image sensor of claim 8, wherein the light-shielding structure is formed from a light-blocking material including at least one of tungsten, chromium, titanium, a metal or a metal alloy.

15. A method of manufacturing a global shutter (GS) complementary metal-oxide semiconductor (CMOS) image sensor (CIS), said method comprising:
- creating a photosensitive region for a pixel of the GS CIS in a semiconductor substrate, said photosensitive region generating a charge in response to illumination by light;
- creating a storage node for the pixel in the semiconductor substrate, said storage node receiving the generated charge from the photosensitive region created for the pixel; and
- creating a light shield over the storage node, said light shield including an extension extending therefrom which protrudes into the substrate and surrounds the storage node, and the extension extends into the substrate to a depth greater than where the storage node is formed in the substrate.

16. The method of claim 15, further comprising:
etching a trench in the substrate around the storage node; and
filling the trench with a light blocking material used to create the light shield.

17. The method of claim 15, wherein creating the photosensitive region includes creating a photodiode and creating the storage node includes creating a capacitor.

18. The method of claim 15, further comprising:
creating a gate structure over the storage node, said gate structure residing under the light shield and serving as a gate terminal of a transistor which regulates an operation of the storage node.

19. The method of claim 15, wherein the extension has a first width at a first end thereof which is proximate to a surface of the substrate where the extension enters the substrate and second width at a second end thereof which is distal from the surface of the substrate, the second width being one of greater than, less than or equal to the first width.

20. The method of claim 15, wherein the shield is formed from a light-blocking material, and the light blocking material is one of tungsten, chromium, titanium, a metal or a metal alloy.

* * * * *